(12) United States Patent
Narita et al.

(10) Patent No.: US 8,779,463 B2
(45) Date of Patent: Jul. 15, 2014

(54) SAPPHIRE SUBSTRATE AND NITRIDE SEMICONDUCTOR LIGHT EMITTING DEVICE

(75) Inventors: Junya Narita, Yoshinogawa (JP); Yohei Wakai, Anan (JP); Takayoshi Wakaki, Anan (JP)

(73) Assignee: Nichia Corporation, Anan-shi (JP)

( * ) Notice: Subject to any disclaimer, the term of this patent is extended or adjusted under 35 U.S.C. 154(b) by 74 days.

(21) Appl. No.: 13/168,604

(22) Filed: Jun. 24, 2011

(65) Prior Publication Data

US 2011/0316041 A1 Dec. 29, 2011

(30) Foreign Application Priority Data

Jun. 28, 2010 (JP) ................................ 2010-146540

(51) Int. Cl.
*H01L 33/00* (2010.01)
(52) U.S. Cl.
USPC ...................... 257/103; 438/46; 257/E33.013
(58) Field of Classification Search
USPC ................ 438/22, 29, 31, 32, 41, 42, 43–46; 257/97, 98, 99, 100, 101, 102, 103, 257/104, 79, 84, 94
See application file for complete search history.

(56) References Cited

U.S. PATENT DOCUMENTS

2005/0179130 A1 8/2005 Tanaka et al.
2008/0303042 A1* 12/2008 Minato et al. ................ 257/98

FOREIGN PATENT DOCUMENTS

| EP | 1 667 241 A1 | 6/2006 |
| JP | 2008-177528 | 7/2008 |
| WO | WO-2005/018008 A1 | 2/2005 |

OTHER PUBLICATIONS

International Preliminary Report on Patentability PCT/JP2011/064355 dated Jan. 15, 2013.
Cheng, J. et al., "Improved crystal quality and performance of GaN-based light-emitting diodes by decreasing the slanted angle of patterned sapphire", Applied Physics Letters, 2010, vol. 96, pp. 051109-1 to 055109-3.
Gao, H. et al., "Enhancement of the light output power of InGaN/GaN light-emitting diodes grown on pyramidal patterned sapphire substrates in the micro-and nanoscale", Journal of Applied Physics, 2008, vol. 103, pp. 014314-1 to 014314-5.
Chen Y-J et al., Fabrication of High-Power InGaN-Based Light-Emitting Diode Chips on Pyramidally Patterned Sapphire Substrate, Japanese Journal of Applied Physics, Japan Society of Applied Physics, JP, vol. 49, No. 2, Feb. 1, 2010, pp. 20201-1, XP001554123.
European Search Report received in European Patent Application No. 11800705.3 dated May 9, 2014.

* cited by examiner

*Primary Examiner* — Julio J Maldonado
*Assistant Examiner* — Robert Bachner
(74) *Attorney, Agent, or Firm* — Foley & Lardner LLP

(57) ABSTRACT

A sapphire substrate having one principal surface on which a nitride semiconductor is grown, said one principal surface having a plurality of projections. Each of the projections has a generally pyramidal shape with a not truncated, more sharpened tip and with an inclined surface composed of a crystal growth-suppression surface that lessens or suppresses the growth of the nitride semiconductor and also which has an inclination change line at which an inclination angle discontinuously varies.

9 Claims, 4 Drawing Sheets

(a)

(b)

SAPPHIRE SUBSTRATE AND NITRIDE SEMICONDUCTOR LIGHT EMITTING DEVICE

BACKGROUND OF THE INVENTION

1. Field of the Invention

The present invention relates to a sapphire substrate for a nitride semiconductor light emitting device and a method for manufacturing the same, and a nitride semiconductor light emitting device incorporating the sapphire substrate.

2. Description of the Related Art

A light emitting diode (LED) made of a nitride semiconductor is usually constituted by sequentially laminating an n-type semiconductor layer, an active layer and a p-type semiconductor layer on a sapphire substrate. In this light emitting diode, emitted light is extracted from the side opposite the sapphire substrate or the side of the sapphire substrate, while light emitted from the active layer is also radiated in a direction opposite the light emission side. Therefore, it becomes necessary to improve external quantum efficiency by enabling light radiated in a direction opposite the light emission side to be extracted effectively from the light emission side.

For example, JP-A-2008-177528 discloses that external quantum efficiency is improved by arranging a plurality of truncated triangular pyramid-shaped projections on a sapphire substrate. JP-A-2008-177528 also describes that generation of voids and deterioration of crystallinity can be lessened by enabling crystal growth on a surface, on which truncated triangular pyramid-shaped projections are formed, through the projections.

However, the present inventors have intensively studied and found that crystallinity of a nitride semiconductor grown on a surface with truncated triangular pyramid-shaped dimples is not necessarily satisfactory.

With the increase of the output of a light emitting diode, problems due to crystal defects, which have not arisen in prior light emitting diodes, have recently arisen.

SUMMARY OF THE INVENTION

Thus, an object of the present invention is to provide a sapphire substrate for a nitride semiconductor light emitting device that enables the growth of a nitride semiconductor having more improved, possibly excellent crystallinity, and also can constitute a nitride semiconductor light emitting device having more improved, even excellent light extraction efficiency, and a method for manufacturing the same.

Another object of the present invention is to provide a nitride semiconductor light emitting device that includes a nitride semiconductor having excellent crystallinity, and is also excellent in light extraction efficiency.

In order to try to achieve the aforementioned objects, the sapphire substrate according to the present invention is a sapphire substrate having one principal surface on which a nitride semiconductor is grown to form a nitride semiconductor light emitting device, said one principal surface having a plurality of projections. And each of the projections has a pyramidal shape with a not truncated, more sharpened tip and with an inclined surface which is composed of a crystal growth-suppression surface that lessens or suppresses the growth of the nitride semiconductor in comparison with a substrate surface located between adjacent projections and also which has an inclination change line at which an inclination angle discontinuously varies.

In the sapphire substrate according to the present invention, a bottom surface of each projection has a generally polygonal shape with outwardly bulged circular arc-shaped three or more sides, the inclined surface is composed of a plurality of generally triangular inclined surfaces including both ends of each side and the substantially sharpened tip as a vertex, and an inclination angle of each inclined surface discontinuously varies in the inclination change line.

In the sapphire substrate according to the present invention, regarding each inclined surface of the projection, an inclination angle of the inclined surface above the inclination change line is preferably smaller than that of the inclined surface below the inclination change line.

In the sapphire substrate according to the present invention, the projections are preferably located on one principal surface in a mutually separated state.

In the sapphire substrate according to the present invention, the projections are periodically arranged on said one principal surface, preferably, and the projections are located on vertexes of a triangular lattice, a quadrangular lattice, or a hexagonal lattice as a periodical arrangement of the projection.

A nitride semiconductor light emitting device according to the present invention comprises the sapphire substrate according to the present invention and a nitride semiconductor layer formed by growing a nitride semiconductor on said one principal surface of the sapphire.

The method for manufacturing a sapphire substrate for a nitride semiconductor light emitting device according to the present invention is a method for manufacturing a sapphire substrate for a nitride semiconductor light emitting device, including:

a first etching step of forming a first mask on the C-plane of a sapphire substrate, and etching the sapphire substrate using the first mask as an etching mask to form a lower projection having a truncated pyramidal shape, a first mask removing step of removing the first mask thereby exposing a top surface of the lower projection, and a second etching step of further etching the lower projection whose top surface has been exposed to form an upper projection having a pyramidal shape with a substantially sharpened tip on the lower projection.

In the sapphire substrate according to the present invention constituted as mentioned above, because each of a plurality of projections formed on one principal surface has a pyramidal shape with a substantially sharpened tip, and each inclined surface of the projection is composed of a crystal growth-suppression surface that lessens or suppresses the growth of the nitride semiconductor in comparison with a substrate surface located between adjacent projections, and also has an inclination change line at which an inclination angle discontinuously varies, the sapphire substrate enables the growth of a nitride semiconductor having improved or excellent crystallinity, and also can constitute a nitride semiconductor light emitting device having improved or excellent light extraction efficiency.

DETAILED DESCRIPTION OF THE INVENTION

Embodiments of the present invention will be described below with reference to the accompanying drawings. The light emitting device described below is presented for the purpose of embodying and exemplifying the technical idea of the present invention, but the present invention is not limited to the following. It is intended that the scope of the invention is not limited to the size, material, shape, relative arrangement, and so on of constitutional components described below unless otherwise specified, and are merely explanatory examples. The size, positional relation, and so on of members illustrated by the respective drawings may be sometimes exaggerated for clear explanation. Furthermore, the respective elements constituting the present invention may include an aspect in which a plurality of elements are constituted from the identical member and one member is allowed to serve as a plurality of elements. To the contrary, a plurality of member can also share the function of one member.

Figure 1:
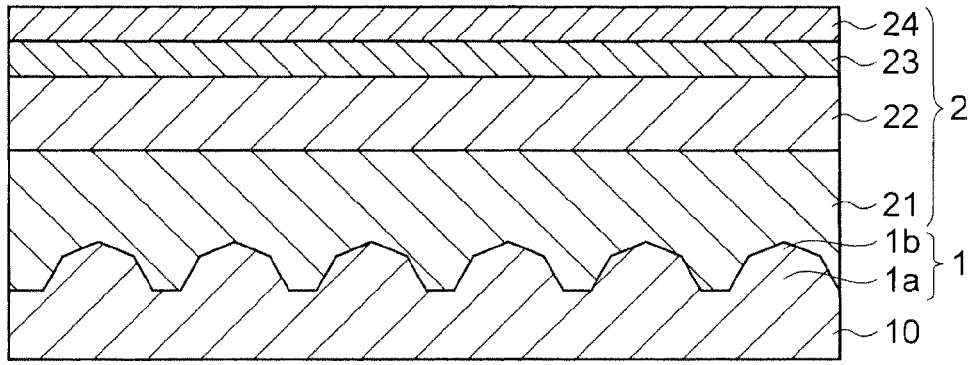
FIG. 1 is a sectional view of a nitride semiconductor light emitting device according to an embodiment of the present invention.

As shown in FIG. 1, the nitride semiconductor light emitting device according to an embodiment of the present invention is provided with a semiconductor laminated structure 2 in which a base layer 21, a first conductive layer (n-type layer) 22, an active layer (emissive layer) 23 and a second conductive layer (p-type layer) 24 are sequentially laminated on a sapphire substrate 10, and a plurality of projections (dimples) 1, each having a generally pyramidal shape with a substantially sharpened tip, are provided on a surface of the substrate 10 on which the base layer 21 is grown.

In the nitride semiconductor light emitting device of the embodiment constituted as mentioned above, as described in detail hereinafter, because the base layer 21, the first conductive layer (n-type layer) 22, the active layer (emissive layer) 23 and the second conductive layer (p-type layer) 24, each being made of a nitride semiconductor, are grown on a surface of the substrate 10 provided with a plurality of projections (dimple) 1, each having a generally pyramidal shape with a substantially sharpened tip, the semiconductor layers can be grown with satisfactory crystallinity.

In the semiconductor light emitting device of the embodiment, it also becomes possible to efficiently reflect light emitted from the emissive layer 23 in the light emission direction by a plurality of projections 1, each having a generally pyramidal shape with a substantially sharpened tip, and thus light extraction efficiency can be enhanced.

Specifically, light that propagates in the transverse direction can be reflected and diffracted on projection 1, particularly an inclined surface of projection 1.

Figure 2:
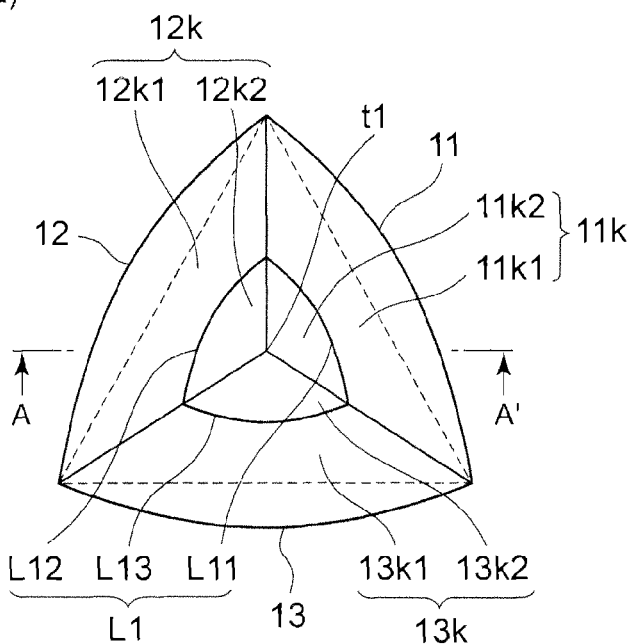
FIG. 2(a) is a plan view of a projection 1 in a nitride semiconductor light emitting device of the embodiment.
FIG. 2(b) is a sectional view taken along lines A-A' of FIG. 2(a).
Figure 2:
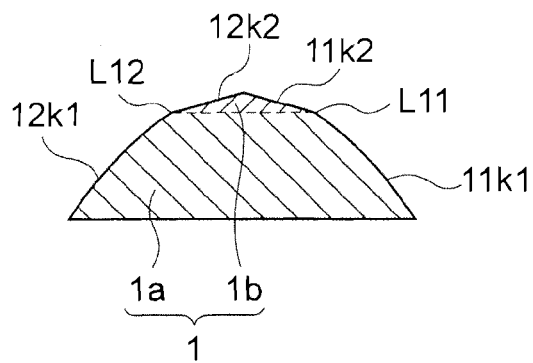

In the embodiment, the projection (dimple) 1 is formed into a generally triangular pyramid shape, as shown in FIGS. 2(a) and 2(b), (i) a bottom surface of the projection has a generally triangle shape (generally triangle shape in which the respective sides 11, 12 and 13 are outwardly bulged in a circular arc shape), and (ii) three inclined surfaces 11k, 12k and 13k of the projection 1 respectively have an outwardly bulged generally triangle shape and also respectively include inclination change lines (etching change lines) L11, L12 and L13 in the middle thereof, and inclination discontinuously varies at the inclination change line as the border.

More specifically, in the respective inclined surfaces 11k, 12k and 13k, the inclined surfaces 11k, 12k and 13k are respectively bent at inclination change lines L11, L12 and L13, and the inclination at the side above inclination change lines L11, L12 and L13 (vertex side) is more gentle than the inclination at the side below inclination change lines (bottom surface side).

The projection (dimple) 1 has a generally triangular pyramid shape and a vertex t1 thereof is substantially sharpened.

As used herein, a substantially sharpened vertex means that a vertex portion (top surface) of the projection 1 becomes smaller so that a nitride semiconductor does not grow from the vertex of the projection (dimple) 1.

In the semiconductor light emitting device of the embodiment constituted as mentioned above, light that propagates in a surface direction of a substrate among light emitted from an emissive layer 23 is irregularly reflected or diffracted by a surface between projections 1 of a substrate surface and inclined surfaces 11k, 12k and 13k of the projection 1.

Particularly, as shown in FIGS. 2(a) and 2(b), because inclined surfaces 11k, 12k and 13k of the projection 1 of the present embodiment are outwardly bulged curved surfaces, light incident like a so-called convex mirror is diffused and reflected so as to be spread. Furthermore, because inclination discontinuously varies at inclination change lines 11k, 12k and 13k as the border, incident light is spread in a more wide range.

The projections 1 having a generally triangular pyramid shape of the present embodiment being discussed can be formed by setting the crystal form of a substrate, the plane direction of a substrate surface on which projection 1 are formed, the mask shape and size, and the etching conditions according to the objective shape.

For example, when a circular first mask is formed on a surface made of the C-plane of a sapphire substrate and etching is carried out, the portion on which no mask is formed is removed by etching to form a circular projection reflecting a mask shape faithfully in an initial stage. As etching proceeds, an influence of direction dependency of an etching rate (an etching proceeding rate varies depending on a direction) caused by a crystal form is exerted, resulting in a shape reflecting the crystal form.

Specifically, because the etching rate varies depending on an etching progress direction, etching proceeds as a result of reflecting of the crystal form, and thus three vertices of a bottom portion and a ridge line of a triangular pyramid gradually become clear to form a lower projection 1a having a generally triangular pyramid-shape below a circular mask. A top surface of the lower projection 1a having a generally triangular pyramid-shape is etched in a generally triangular shape and the area becomes smaller than that of the circular mask by undercut. A bottom surface and a top surface of the lower projection 1a becomes a generally triangle shape in which the respective sides are outwardly bulged in a circular arc shape. As etching proceeds, the area becomes smaller and also a curvature radius of a circular arc of each side becomes larger, and thus each side becomes linear.

In the present embodiment being discussed, after the lower projection 1a is formed and a first mask is removed, a second mask is formed on a top surface of the lower projection 1a or etching is carried out without forming the second mask, thereby further forming an upper projection 1b having a triangular pyramid shape on the lower projection 1a to form a projection (dimple) 1 having a generally triangular pyramid shape, including inclined surfaces 11k, 12k and 13k in which inclination discontinuously varies at inclination change lines L11, L12 and L13 as the border.

In the present embodiment being discussed, in case the lower projection is formed by etching and the upper projection is formed by etching, when an etching time is prolonged, it is possible to form a projection 1 into a generally triangular pyramid shape in which the respective sides 11, 12 and 13 of a bottom surface are linear and inclined surfaces 11k, 12k and 13k are flat, and it is also possible to form a projection 1 into a generally triangular pyramid shape in which the respective sides 11, 12 and 13, and inclined surfaces 11k, 12k and 13k of a bottom surface have an inwardly curved circular arc-shape.

Also, projections 1 on the substrate enable an improvement in optical output and light extraction efficiency and, in case the base layer 21 is grown, inclined surfaces 11k, 12k and 13k of projection 1 serve as a surface of suppressing the growth of the base layer 21 (also referred to as a crystal growth-suppression surface) and enables promotion of the growth of a base layer grown from a surface between projections 1 (hereinafter referred to as a crystal growth surface) in a transverse direction to form the base layer 21 having a surface with less crystal defects. Accordingly, it is preferred that projections constituting the crystal growth-suppression surface are uniformly distributed in the crystal growth surface, and are regularly arranged in a mutually separated state as shown in FIGS. 3 to 4.

Figure 3:
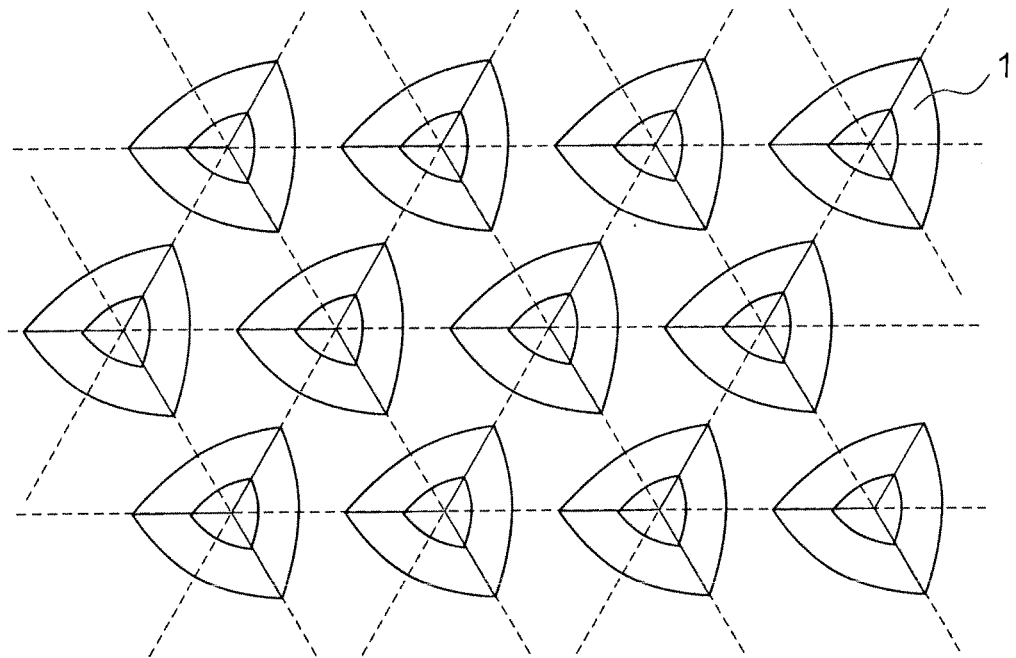
FIG. 3 is a plan view showing an example of an arrangement of projections 1 in a nitride semiconductor light emitting of the embodiment.
Figure 4:
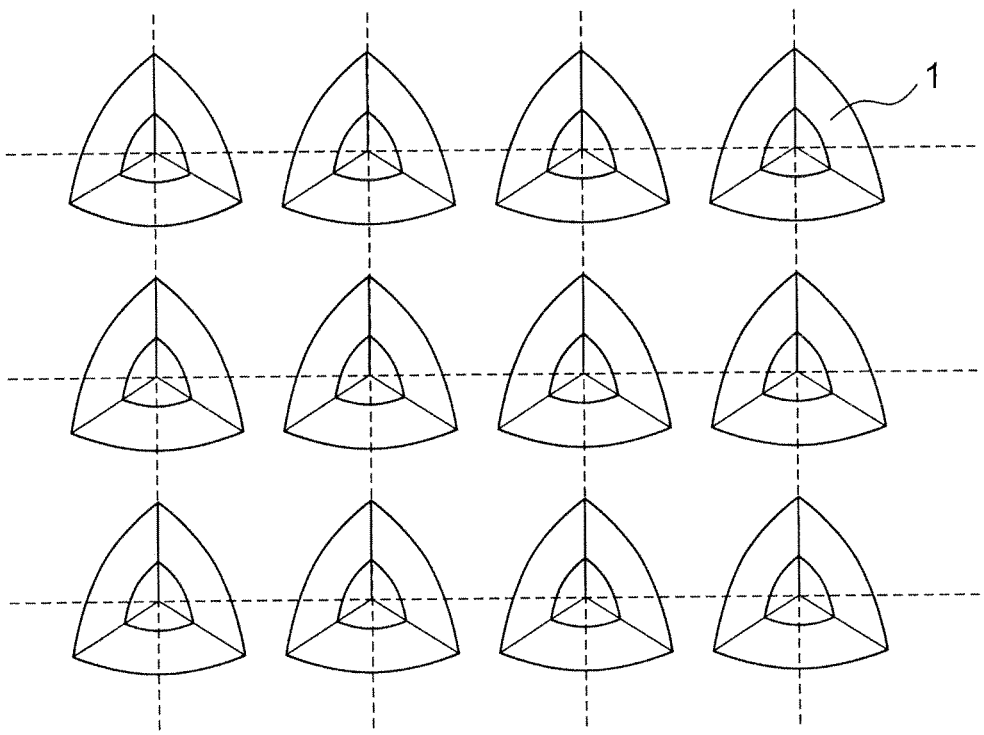
FIG. 4 is a plan view showing another example of an arrangement of projections 1 in a nitride semiconductor light emitting of the embodiment.

FIG. 3 is a triangular lattice point arrangement, and FIG. 4 is a square lattice point arrangement.

In a nitride semiconductor grown from the crystal growth surface in a lengthwise direction, because dislocations caused by a difference between a lattice constant of a substrate and a lattice constant of a nitride semiconductor tend to extend in a growth direction and to appear on a surface, projections 1 on the substrate are preferably formed at a high density. In this manner, when projections 1 are arranged at a high density, a ratio of an area of the crystal growth-suppression surface to the crystal growth surface becomes higher. Therefore, a ratio of a nitride semiconductor grown in the transverse direction, which covers the crystal growth-suppression surface, increases and thus dislocations extending in the growth direction are confined within the base layer 21 and dislocations or "pits" that appear on the surface can be decreased.

Furthermore, regarding projections 1 of the present embodiment, because the inclination at the side above inclination change lines L11, L12 and L13 (vertex side) is more gentle than that at the side below inclination change lines (bottom surface side) in the respective inclined surfaces 11k, 12k and 13k, the growth of a nitride semiconductor in the transverse direction is more promoted at inclination change lines L11, L12 and L13 as the border. In this way, a nitride semiconductor having more satisfactory crystallinity is formed and also flattening of a surface of the grown nitride semiconductor is promoted.

Additional examples of the regular and high-density arrangement of the projection 1 include, in addition to the triangular lattice point arrangement and the square lattice point arrangement as shown in FIGS. 3 to 4, arrangements such as a parallelogram lattice point arrangement and a rectangular lattice point arrangement.

This regular structure may be arranged with the same regularity in the entire substrate surface, or may be arranged with the different regularity according to electrode arrangement of a semiconductor device structure formed on a substrate.

In this manner, in order to grow a nitride semiconductor having satisfactory crystallinity, the height of the projection 1 is set within a range of 0.5 μm or more and 2 μm or less, and preferably within a range of 0.7 μm or more and 1.2 μm or less, and the interval (interval of the narrowest portion) of projections 1 is set within a range of 0.5 μm or more and 2 μm or less, and preferably 1.5 μm or less.

One side (a linear distance between vertices of a bottom surface) of the bottom surface of the projection 1 is set within a range of 0.5 μm or more and 3 μm or less, and preferably within a range of 0.7 μm or more and 2 μm or less.

It is possible to form a projection 1, that includes a substantially sharpened vertex ti and also includes inclined surfaces 11k, 12k and 13k composed of a crystal growth-suppression surface in which an inclination angle discontinuously varies above and below inclination change lines L11, L12 and L13, on a substrate 10, for example, by a two-stage etching described below.

<First Etching Step>

Figure 5:
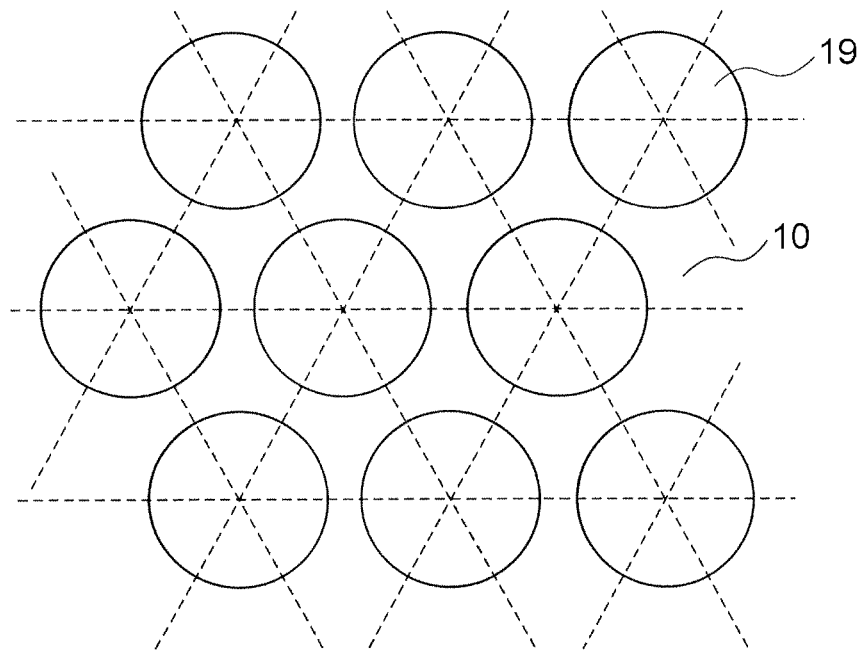
FIG. 5 is a plan view when a first mask 19 for the second etching step is formed in a method for manufacturing a nitride semiconductor light emitting device according to the embodiment.

In the present production method, first, as shown in FIG. 5, a circular first mask 19 is formed on the C-plane (0001) of a sapphire substrate 10 and, after etching a substrate, the first mask 19 is removed.

Figure 6:
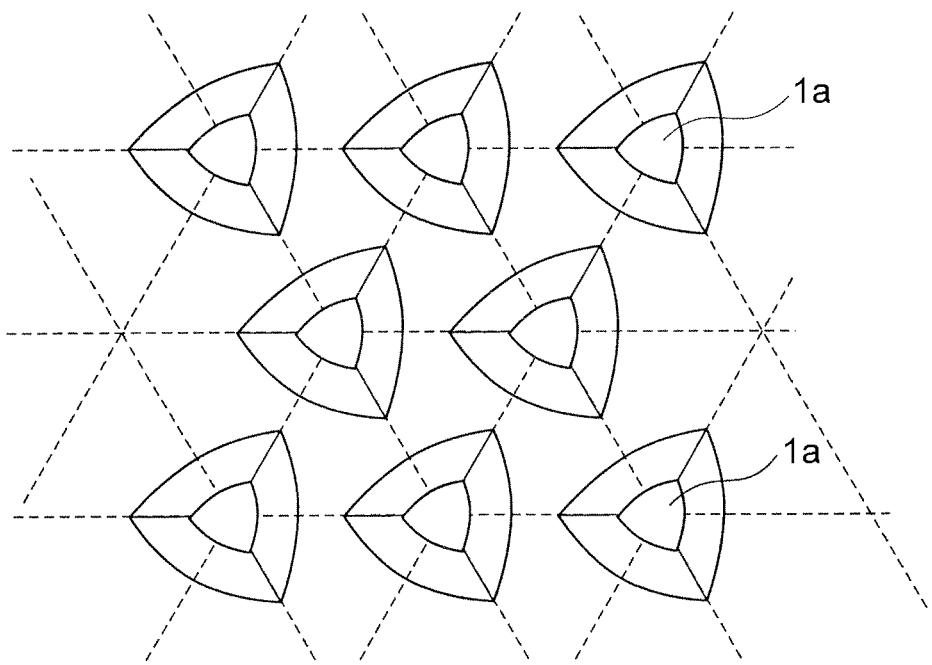
FIG. 6 is a plan view of a substrate surface after the first etching step in a method for manufacturing a nitride semiconductor light emitting device according to the embodiment.

Whereby, a generally triangular pyramid-shaped lower projection 1a including a generally triangular top surface is formed (FIG. 6).

The etching method includes a wet etching method and a dry etching method, and any etching method may be used in the present invention. Specifically, a vapor phase etching method, a plasma etching method and a reactive ion etching method can be used as the dry etching method. Examples of an etching gas used in the case of etching include Cl-based and F-based gases, for example, $Cl_2$, $SiCl_4$, $BCl_3$, HBr, $SF_6$, $CHF_3$, $C_4F_8$, $CF_4$, and an inert gas such as Ar.

It is possible to use, as an etching solution for wet etching, phosphoric acid, or pyrophosphoric acid, or mixed acid prepared by adding sulfuric acid thereto, or potassium hydroxide in case of a sapphire substrate of Example. At this time, silicon oxide such as $SiO_2$ can be appropriately selected as a mask material according to a substrate material and an etching solution therefor, and examples thereof include oxides of at least one element selected from the group consisting of V, Zr, Nb, Hf, Ti, Ta and Al, and nitrides of at least one element selected from the group consisting of Si, B and Al.

<Second Etching Step>

Figure 7:
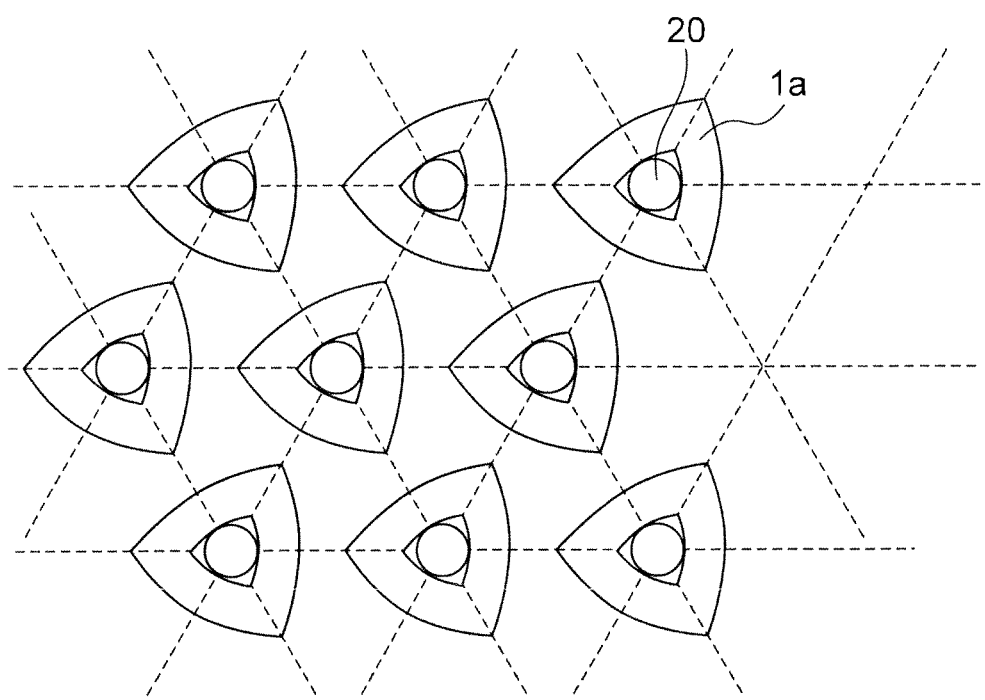
FIG. 7 is a plan view of a substrate surface when a second mask for the second etching step is formed in a method for manufacturing a nitride semiconductor light emitting device according to the embodiment.

Next, as shown in FIG. 7, after removing the first mask 19, a circular second mask 20 is formed on a top surface of the lower projection 1a, or the substrate 1 is further etched without forming the second mask 20.

In this etching step, etching is allowed to proceed until at least an upper projection having a substantially sharpened tip is formed on the top surface of the lower projection.

This etching method may be either a wet etching method or a dry etching method similar to the first etching step.

It is also possible to employ, as the etching method, an etching method that is different from that of the first etching step. That is, the wet etching method may be used in the first etching step and the drying etching method may be used in the second etching step, or the method may be alternated.

In the first etching step and the second etching step, the etching gas or etching solution may vary.

It is possible to form a projection 1, that includes a substantially sharpened vertex t1 and also includes inclined surfaces 11*k*, 12*k* and 13*k* composed of a crystal growth-suppression surface in which an inclination angle discontinuously varies above and below inclination change lines L11, L12 and L13, on a substrate 10, for example, by the aforementioned two-stage etching described.

As mentioned above, when a nitride semiconductor is grown on the C-plane (0001) of sapphire, on which a plurality of tip-sharpened projections 1 including inclined surfaces 11*k*, 12*k* and 13*k* in which an inclination angle discontinuously varies above and below inclination change lines L11, L12 and L13 have been formed, the growth of the nitride semiconductor from inclined surfaces 11*k*, 12*k* and 13*k* of the projection 1 is suppressed (the nitride semiconductor is not substantially grown).

Whereby, the nitride semiconductor grown from the C-plane (0001) surface of sapphire between projections 1 grows on the inclined surface of the projection 1 in the transverse direction, and covers the projection 1 as the growth to obtain a flat GaN surface with less crystal defects, and thus it becomes possible to form, on the flat GaN surface with less crystal defects, a light emitting device structure in which a nitride semiconductor layer with less crystal defects has been laminated.

[Light Emitting Device]

As shown in FIG. 1, a light emitting device structure includes, on a substrate, a laminated structure 2 including first and second conductive layers 22, 24 and an active layer 23 formed therebetween, and also includes a first electrode and a second electrode formed on the first conductive layer 22 and the second conductive layer 24 exposed by removing a portion of the active layer 23 and the second conductive layer 24. The second electrode includes a translucent ohmic electrode formed over nearly the entire surface of the second conductive layer 24, a pad formed on the translucent ohmic electrode, and a diffusion electrode.

In the formation of a light emitting device, it is possible to use, as a semiconductor grown on a substrate, a gallium nitride-based compound semiconductor material represented by the general formula: $In_xAl_yGa_{1-x-y}N$ ($0 \leq x \leq 1$, $0 \leq y \leq 1$, $0 \leq x+y \leq 1$). As mentioned hereinafter, binary and tertiary mixed crystals thereof can be used particularly suitably. It is possible to apply to, in addition to a nitride semiconductor, other semiconductors such as GaAs- and GaP-based compound semiconductors, AlGaAs- and InAlGaP-based compound semiconductors.

Examples according to the present invention will be described below.

EXAMPLE 1

On the C-plane (0001) of a sapphire substrate, a $SiO_2$ film was formed, followed by patterning to periodically form a circular first mask 19 having a diameter of about 1.5 μm.

Subsequently, the substrate was immersed in an etching bath using a mixed acid of phosphoric acid and sulfuric acid as an etching solution and etched at a solution temperature of about 290° C. for about 5 minutes until the depth (projection height) becomes about 1 μm.

Whereby, a lower projection 1*a* was formed.

Next, after removing the first mask 19, the substrate was immersed in an etching bath using a mixed acid of phosphoric acid and sulfuric acid as an etching solution, in a state of absence of a mask, and etched at a solution temperature of about 290° for about 1 minute until a tip of projection is substantially sharpened to form an upper projection 1*b*.

A projection 1 having a height of about 1 μm and a two-stage taper angle was formed by the aforementioned steps.

Subsequently, the substrate was transferred to a MOCVD device, where a 20 nm thick GaN buffer layer grown at a low temperature (about 510° C.) was formed on a substrate surface with projection 1 formed thereon, and GaN was c-axis grown thereon at a high temperature (about 1,050° C.) to form a base layer 21 having a flat surface.

On the thus obtained substrate with the base layer 21 formed thereon, as shown in FIG. 1, an n-type layer 22 such as an n-type contact layer, an active layer 23 and a p-type layer 24 were formed to manufacture a semiconductor device structure.

Specifically, as the first conductive layer 22 (n-type layer), an n-side contact layer having a film thickness of 5 μm made of Si ($4.5 \times 10^{18}/cm^3$) doped GaN, 0.3 μm thick undoped GaN layer, 0.03 μm thick Si ($4.5 \times 10^{18}/cm^3$) doped GaN layers, 5 nm thick undoped GaN layer, a multi-layered film obtained by repeatedly and alternately laminating each 10 layers of 4 nm thick undoped GaN layers and 2 nm thick undoped $In_{0.1}Ga_{0.9}N$ layers are formed on the aforementioned base layer 21. As the active layer 23, a multiple quantum well structure obtained by repeatedly and alternately laminating each 6 layers of barrier layers having a film thickness of 25 nm made of undoped GaN and well layers having a film thickness of 3 nm made of $In_{0.3}Ga_{0.7}N$ nd finally laminating a barrier layer is formed on the n-type layer. As the second conductive layer (p-type layer) 24, a p-side multi-layered film layer which has a structure obtained by repeatedly and alternately laminating each 5 layers of 4 nm thick Mg ($5 \times 10^{19}/cm^3$) doped $Al_{0.15}Ga_{0.85}N$ layers and 2.5 nm thick Mg ($5 \times 10^{19}/cm^3$) doped $In_{0.03}Ga_{0.97}N$ layers; and finally laminating with the AlGaN layer formed thereon and a p-side contact layer having a film thickness 0.12 μm made of Mg ($1 \times 10^{20}/cm^3$) doped GaN are formed on the active layer. With this, a structure (emission wavelength of 465 nm, blue LED) can be obtained.

The semiconductor device structure was provided with an electrode having a structure in which ITO (about 170 nm) is formed as a translucent ohmic electrode on a surface of a p-type layer 24, that would serve as a surface of an emitting structure portion, and then Rh (about 100 nm), Pt (about 200 nm) and Au (about 500 nm) are laminated in this order on ITO and the n-side contact layer.

BRIEF DESCRIPTION OF REFERENCE NUMERALS

1: Projection
1*a*: Lower projection
1*b*: Upper projection
2: Semiconductor laminated structure
10: Substrate
t1: Vertex
L11, L12 and L13: Inclination change lines
11*k*, 12*k* and 13*k*: Inclined surfaces
19: First mask
20: Second mask
21: Base layer
22: n-type layer (First conductive layer)
23: Active layer
24: p-type layer (Second conductive layer)

What is claimed is:

1. A sapphire substrate having a principal surface on which a nitride semiconductor is growable to form a nitride semiconductor light emitting device, the sapphire substrate comprising a plurality of projections on the principal surface, wherein each of the projections has a generally triangular pyramidal shape with a substantially sharpened tip and an inclined surface, the inclined surface being composed of a crystal growth-suppression surface that lessens the growth of the nitride semiconductor in comparison with a substrate surface located between adjacent projections, the inclined surface having an inclination change line at which an inclination angle discontinuously varies, wherein said plurality of projections are arranged to form a triangular lattice, and a direction of each of said plurality of projections conforms with a direction that is rotated by about 30 degrees from a direction of a triangle of the triangular lattice, and wherein an upper part of each of said projections above said inclination change line, which includes said substantially sharpened tip, has a height that is smaller than a height of a lower part of each of said projection below said inclination change line.

2. The sapphire substrate according to claim 1, wherein a bottom surface of the projection has a generally triangular shape with outwardly bulged arc-shaped side, the inclined surface has a generally triangular shape of which three vertexes are (i) a first end of the outwardly bulged arc-shaped side, (ii) a second end of the outwardly bulged arc-shaped side, and (iii) the substantially sharpened tip.

3. The sapphire substrate according to claim 1, wherein an inclination angle of the inclined surface above the inclination change line is smaller than that of the inclined surface below the inclination change line.

4. The sapphire substrate according to claim 1, wherein the projections are located separately on the principal surface.

5. The sapphire substrate according to claim 1, wherein the projections are periodically arranged on the principal surface.

6. The sapphire substrate according to claim 5, wherein the projections are located on vertexes of a triangular lattice, a quadrangular lattice or a hexagonal lattice.

7. A nitride semiconductor light emitting device comprising: the sapphire substrate according to claim 1; and a nitride semiconductor layer formed by growing a nitride semiconductor on the principal surface of the sapphire.

8. The sapphire substrate according to claim 1, wherein the arrangement of said plurality of projections is such that:

where one of the plurality of projections is defined to have a first vertex, a second vertex, and a third vertex, where a first imaginary line is defined to cross the first vertex and the second vertex, and where a second imaginary line is defined to cross the second vertex and the third vertex, both of said first imaginary line and said second imaginary line cross the same single projection that is adjacent to said one of the plurality of projections.

9. The sapphire substrate according to claim 1, wherein the arrangement of said plurality of projections is such that imaginary line crossing two vertexes of one of said plurality of projections crosses another projection that is located in the same triangle of the triangular lattice as said one of said plurality of projections.

* * * * *